US008854853B2

(12) United States Patent
Chou et al.

(10) Patent No.: US 8,854,853 B2
(45) Date of Patent: Oct. 7, 2014

(54) TECHNOLOGY OF MEMORY REPAIR AFTER STACKING OF THREE-DIMENSIONAL INTEGRATED CIRCUIT

(75) Inventors: Yung-Fa Chou, Kaohsiung (TW); Ding-Ming Kwai, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 376 days.

(21) Appl. No.: 13/294,181

(22) Filed: Nov. 11, 2011

(65) Prior Publication Data

US 2013/0064026 A1 Mar. 14, 2013

(30) Foreign Application Priority Data

Sep. 13, 2011 (TW) .............................. 100132840 A

(51) Int. Cl.
*G11C 5/06* (2006.01)
(52) U.S. Cl.
USPC ............................ 365/51; 365/200; 365/225.7
(58) Field of Classification Search
USPC ............................... 365/200, 51, 225.7, 96, 63
See application file for complete search history.

(56) References Cited

U.S. PATENT DOCUMENTS

| 5,383,156 | A | | 1/1995 | Komatsu | |
|---|---|---|---|---|---|
| 5,502,333 | A | * | 3/1996 | Bertin et al. | 257/685 |
| 5,574,689 | A | * | 11/1996 | Morgan | 365/200 |
| 5,652,725 | A | * | 7/1997 | Suma et al. | 365/200 |
| 5,768,197 | A | * | 6/1998 | Choi | 365/200 |
| 5,790,462 | A | * | 8/1998 | McClure | 365/189.02 |
| 5,862,087 | A | * | 1/1999 | Lee | 365/200 |
| 6,111,798 | A | | 8/2000 | Lee | |
| 6,118,712 | A | | 9/2000 | Park et al. | |
| 6,154,851 | A | | 11/2000 | Sher et al. | |
| 6,256,237 | B1 | | 7/2001 | Ho et al. | |
| 6,650,577 | B2 | | 11/2003 | Hartmann | |
| 7,312,109 | B2 | | 12/2007 | Madurawe | |
| 2009/0009003 | A1 | | 1/2009 | Roth et al. | |
| 2010/0085825 | A1 | * | 4/2010 | Keeth et al. | 365/200 |

FOREIGN PATENT DOCUMENTS

TW 201027545 7/2010

* cited by examiner

*Primary Examiner* — Douglas King

(74) *Attorney, Agent, or Firm* — Jianq Chyun IP Office

(57) ABSTRACT

A three-dimensional integrated circuit (3-D IC) includes a controller chip and at least one memory chip, in which, besides an original storage capacity, the memory chip further includes multiple spare memory cells and an address translation circuit with an external activation/enablement function. After the memory chip and the controller chip are stacked, the controller chip may still activate/enable a spare in the memory chip to repair a damaged or deteriorated memory cell in the memory chip through at least one vertical interconnect (for example, through-silicon via (TSV)), regardless of whether the damaged or deteriorated memory cell has been repaired or not before the controller chip and the memory chip are stacked.

14 Claims, 6 Drawing Sheets

TECHNOLOGY OF MEMORY REPAIR AFTER STACKING OF THREE-DIMENSIONAL INTEGRATED CIRCUIT

CROSS-REFERENCE TO RELATED APPLICATION

This application claims the priority benefit of Taiwan application serial no. 100132840, filed on Sep. 13, 2011. The entirety of the above-mentioned patent application is hereby incorporated by reference herein and made a part of this specification.

BACKGROUND OF THE INVENTION

1. Field of the Invention

The disclosure relates to a three-dimensional integrated circuit (3-D IC), and more particularly, to a 3-D IC and a method capable of repairing a memory chip after the chip is stacked with a controller chip.

2. Description of Related Art

A 3-D IC stacks and connects chips vertically by using the through-silicon via (TSV) technology. A TSV is an electrical conductor which passes completely through the silicon substrate of a chip. By introducing the vertical interconnect, a system design allows accessing the front side of the chip from the backside or vice versa. The length of the TSV is about equal to the thickness of the chip, and is usually shorter than 100 μm. Hence, a long wire between two components on a system on chip (SoC) may be eliminated by placing the two components on two separate chips and routing their connection through the TSV, so the propagation delay can be reduced significantly. In addition, the density of the TSVs may be higher than $100/mm^2$, and therefore, the TSVs may provide a high bandwidth in the 3-D IC.

At present, a spare memory (having multiple spare memory cells that are added into a memory array typically in a form of redundant row or redundant column) is usually built in a memory chip, so as to replace a damaged memory cell if there exists one.

However, even a well tested and repaired memory chip may be damaged again during the process of TSV forming, wafer thinning, and chip stacking of the 3-D IC. At this time, the spare memory may not be used up, but the chip stacking should be announced as a failure, because it is impossible to record any newly added failure address after chip stacking. Using a conventional method of programming by laser excision, for example, the front side of a chip after stacking may be covered by an upper- or lower-layer chip, and unable to have a fuse be blown. Obviously, as it fails to repair the memory chip by replacing the damaged memory cell with a spare after chip stacking, the enhancement of manufacturing yield of the 3-D IC becomes one of the major tasks at present.

SUMMARY OF THE INVENTION

Accordingly, an exemplary embodiment provides a 3-D IC, which at least includes a controller chip and a memory chip. The controller chip includes a control circuit, and the memory chip includes an address translation circuit with an external activation/enablement function. After the controller chip and the memory chip are stacked, the controller chip, in response to the setting of the control circuit and a preset condition associated with the address translation circuit in the memory chip, controls the address translation circuit through at least one vertical interconnect, so as to activate/enable at least one spare (i.e. unused redundant row or redundant column) in the memory chip to repair at least one damaged memory cell in the memory chip after stacking.

Another exemplary embodiment provides a method for memory repair after chip stacking of a 3-D IC, which includes: designing a control circuit in a controller chip, and designing an address translation circuit with an external activation/enabling function in a memory chip; activating the external activation/enablement function for unused spares in the memory chip before stacking; and after the controller chip and the memory chip are stacked, enabling the controller chip to, in response to the setting of the control circuit, control the address translation circuit in the memory chip through at least one TSV, so as to activate/enable at least one redundant row and/or one redundant column in the memory chip to repair at least one damaged memory cell in the memory chip.

Furthermore, another exemplary embodiment provides a method for memory repair after chip stacking of a 3-D IC, which includes: activating/enabling at least one spare in a stacked memory chip through a stacked controller chip to replace at least one damaged memory cell in the stacked memory chip.

It should be noted that the above descriptions and the following embodiments are merely exemplary for illustration, which are not intended to limit the scope of the disclosure.

Several exemplary embodiments accompanied with figures are described below to further clarify the disclosure in detail.

BRIEF DESCRIPTION OF THE DRAWINGS

The accompanying drawings are included to provide further understanding, and are incorporated in and constitute a part of this specification. The drawings illustrate exemplary embodiments and, together with the descriptions, serve to explain the principles of the disclosure.

DETAILED DESCRIPTION OF DISCLOSED EMBODIMENTS

Figure 1:
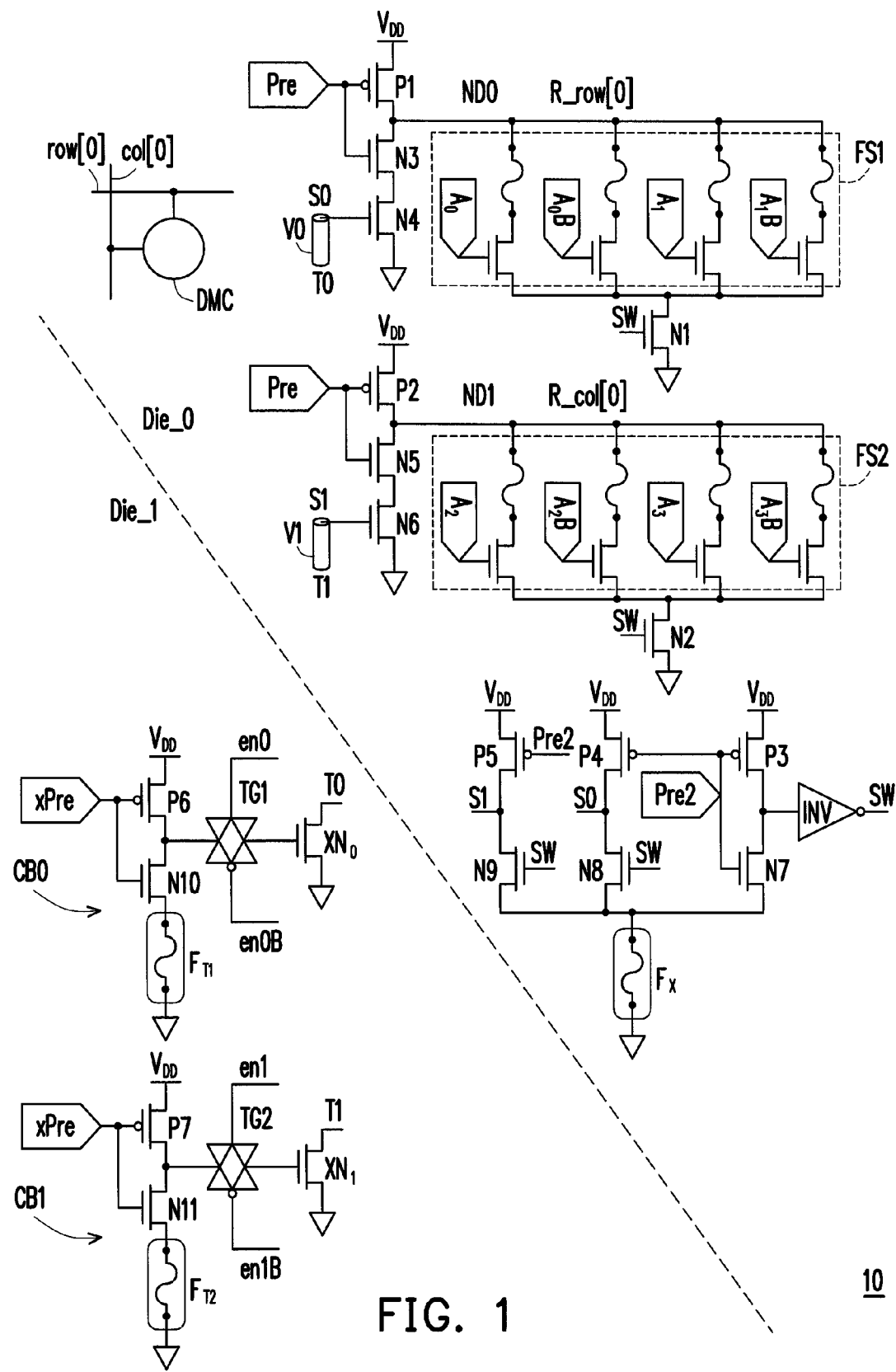
FIG. 1 is a schematic view of a 3-D IC, consisting of a controller chip Die_1 and a memory chip Die_0, according to an exemplary embodiment.

The exemplary embodiments of the disclosure are illustrated in detail below with reference to the accompanying drawings. In addition, components/members of the same reference numerals are used to represent the same or similar parts in the accompanying drawings and implementations wherever it is possible.

It should be noted that, at present, the process to manufacture a memory chip before stacking becomes mature as time passes by. The number of damaged memory cells that need to be repaired (namely, bit failures) is decreasing, and the number of spares that are unused is increasing. In such a situation, the disclosure provides a technique of memory repair after chip stacking, to activate/enable a spare in a memory chip from another stacked chip. In this manner, an inconvenient access to an internal fuse circuit after chip stacking is solved. At the same time, flexible usage of the spare memory is provided, and the yield of the 3-D IC is improved.

Accordingly, FIG. 1 is a schematic view of a 3-D IC 10 according to an exemplary embodiment. Referring to FIG. 1, the 3-D IC 10 includes at least a controller chip Die_1 and a memory chip Die_0, where a redundant row R_row[0] and a redundant column R_col[0] are equipped in the memory chip Die_0, but the disclosure is not limited thereto. The controller chip Die_1 may include a control circuit formed by two sub-control units CB0 and CB1, corresponding to the two redundant components. The memory chip Die_0 may include an address translation circuit with an external activation/enablement function.

In the exemplary embodiment, after the controller chip Die_1 and the memory chip Die_0 are stacked, the controller chip Die_1 may, in response to the setting of the control circuit and a preset condition associated with the address translation circuit capable of external activation/enablement (which will be described later), control the address translation circuit of the memory chip Die_0 through vertical interconnects (for example, TSVs V0 and V1) to activate/enable either redundant row R_row[0] or redundant column R_col[0] in the memory chip Die_0, so as to repair a damaged memory cell DMC selected by a column col[0] and a row row[0] in the memory chip Die_0.

More clearly, the address translation circuit of the memory chip Die_0 may include P-type transistors P1 and P2, N-type transistors N1 and N2, fuse sets FS1 and FS2 (each consisting of multiple fuses and multiple N-type transistors as selectors), and an address translation circuit external activating/enabling unit formed by P-type transistors P3 to P5, N-type transistors N3 to N9, inverter INV, and fuse Fx. FIG. 1 shows only main circuit components of the fuse sets. Other circuit design may exist. For example, in the disclosure, N-type transistors N1 and N2 are respectively inserted between the fuse sets (FS1 and FS2) and ground, so as to form a tail switch controlled by a signal SW. A circuit design technique to mitigate short-circuit current may add, between fuse set FS1 and N-type transistor N1, an extra N-type transistor with drain connected to fuse set FS1, source connected to N-type transistor N1, and gate connected to the (precharge) control signal Pre. The same manner is equally applicable between fuse set FS2 and N-type transistor N2.

In this embodiment, the gate of P-type transistor P1 is coupled to (or receives) a first precharge control signal Pre, and the source of P-type transistor P1 is coupled to a power supply $V_{DD}$. The gate of N-type transistor N1 is coupled to (or receives) a switch control signal SW, and the source of N-type transistor N1 is coupled to the ground. Fuse set FS1, corresponding to redundant row R_row[0], is coupled between drains of P-type transistor P1 and N-type transistor N1. First ends of the fuses in fuse set FS1 are coupled together to the drain of P-type transistor P1, gates of the N-type transistors in fuse set FS1 are coupled to decoded signals of an input row address [$A_0, A_0B, A_1, A_1B$], drains of the N-type transistors in fuse set FS1 are respectively coupled to second ends of the fuses in fuse set FS1, and sources of the N-type transistors in fuse set FS1 are coupled together to the drain of N-type transistor N1. Decoded row address signals $A_0$ and $A_0B$ are complementary, while decoded row address signals $A_1$ and $A_1B$ are complementary.

The gate of P-type transistor P2 is coupled to (or receives) the precharge control signal Pre, and the source of P-type transistor P2 is coupled to the power supply $V_{DD}$. The gate of N-type transistor N2 is coupled to (or receives) the switch control signal SW, and the source of N-type transistor N2 is coupled to the ground. Fuse set FS2, corresponding to redundant column R_col[0], is coupled between drains of P-type transistor P2 and N-type transistor N2. First ends of the fuses in fuse set FS2 are coupled together to the drain of P-type transistor P2, gates of the N-type transistors in fuse set FS2 are coupled to decoded signals of an input column address [$A_2, A_2B, A_3, A_3B$], drains of the N-type transistors in fuse set FS2 are respectively coupled to second ends of the fuses in fuse set FS2, and sources of N-type transistors in fuse set FS2 are coupled together to the drain of N-type transistor N2. Decoded column address signals $A_2$ and $A_2B$ are complementary, while decoded column address signals $A_3$ and $A_3B$ are complementary.

The address translation circuit external activating/enabling unit, formed by P-type transistors P3 to P5, N-type transistors N3 to N9, inverter INV, and fuse Fx, may be coupled to the control circuit in the controller chip Die_1 through TSVs V0 and V1. In response to the setting of the control circuit in the controller chip Die_1 and the preset condition, it determines whether to activate/enable redundant row R_row[0] and redundant column R_col[0] or not, and provides a switch control signal SW accordingly. The gate of N-type transistor N3 is coupled to the gate of P-type transistor P1, and the drain of N-type transistor N3 is coupled to the drain of P-type transistor P1.

The gate of N-type transistor N4 is coupled to sub-control unit CB0 of the control circuit in the controller chip Die_1 through TSV V0, the drain of N-type transistor N4 is coupled to the source of N-type transistor N3, and the source of N-type transistor N4 is coupled to the ground. The gate of N-type transistor N5 is coupled to the gate of P-type transistor P2, and the drain of N-type transistor N5 is coupled to the drain of P-type transistor P2. The gate of N-type transistor N6 is coupled to sub-control unit CB1 of the control circuit in the controller chip Die_1 through TSV V1, the drain of N-type transistor N6 is coupled to the source of N-type transistor N5, and the source of N-type transistor N6 is coupled to the ground.

The source of P-type transistor P3 is coupled to the power supply $V_{DD}$, and the gate of P-type transistor P3 is coupled to the gate of P-type transistor P4. The gate of P-type transistor P4 is coupled to a precharge control signal Pre2, the source of P-type transistor P4 is coupled to the power supply $V_{DD}$, and the drain of P-type transistor P4 is coupled to the gate of N-type transistor N4. The gate of P-type transistor P5 is coupled to the precharge control signal Pre2, the source of P-type transistor P5 is coupled to the power supply $V_{DD}$, and the drain of P-type transistor P5 is coupled to the gate of N-type transistor N6.

The gate of N-type transistor N7 is coupled to the gate of P-type transistor P4, and the drain of N-type transistor N7 is coupled to the drain of P-type transistor P3. The gate of N-type transistor N8 is coupled to the switch control signal SW, and the drain of N-type transistor N8 is coupled to the drain of P-type transistor P4. The gate of N-type transistor N9 is coupled to the switch control signal SW, and the drain of N-type transistor N9 is coupled to the drain of P-type transistor P5. The input of inverter NV is coupled to the drains of P-type transistor P3 and N-type transistor N7 together, and the output of inverter NV is the switch control signal SW. A first end of fuse Fx is coupled to the sources of N-type transistors N7 to N9 together, and a second end of fuse Fx is coupled to the ground. In this exemplary embodiment, the foregoing preset condition may indicate that, when fuse Fx is blown before the memory chip Die_0 is stacked, the corresponding redundant row R_row[0] and redundant column R_col[0] have not been used, and hence, both can be used to replace at least one newly damaged memory cell after chip stacking.

On the other hand, sub-control unit CB0 of the control circuit in the controller chip Die_1, corresponding to redundant row R_row[0], includes P-type transistor P6, N-type transistors N10 and $XN_0$, fuse $F_{T1}$, and transmission gate TG1. The gate of P-type transistor P6 is coupled to a precharge control signal xPre, and the source of P-type transistor P6 is coupled to the power supply $V_{DD}$. The gate of N-type transistor N10 is coupled to the gate of P-type transistor P6, and the drain of N-type transistor N10 is coupled to the drain of P-type transistor P6. A first end of fuse $F_{T1}$ is coupled to the source of N-type transistor N10, and a second end of fuse $F_{in}$ is coupled to the ground. The input terminal of transmission gate TG1 is coupled to the drain of P-type transistor P6, with two complementary control signals being respectively en0 and en0B. The gate of N-type transistor $XN_0$ is coupled to the output terminal of transmission gate TG1, the drain of N-type transistor $XN_0$ is coupled to the gate of N-type transistor N4 through TSV V0, and the source of N-type transistor $XN_0$ is coupled to the ground.

Sub-control unit CB1 of the control circuit in the controller chip Die_1, corresponding to redundant column R_col[0], includes P-type transistor P7, N-type transistors N11 and $XN_1$, fuse $F_{T2}$, and transmission gate TG2. The gate of P-type transistor P7 is coupled to the precharge control signal xPre, and the source of P-type transistor P7 is coupled to the power supply $V_{DD}$. The gate of N-type transistor N11 is coupled to the gate of P-type transistor P7, and the drain of N-type transistor N11 is coupled to the drain of P-type transistor P7. A first end of the fuse $F_{T2}$ is coupled to the source of N-type transistor N11, and a second end of fuse $F_{T2}$ is coupled to the ground. The input terminal of transmission gate TG2 is coupled to the drain of P-type transistor P7, with two complementary control signals being respectively en1 and en1B. The gate of N-type transistor $XN_1$ is coupled to the output terminal of transmission gate TG2, the drain of N-type transistor $XN_1$ is coupled to the gate of N-type transistor N6 through TSV V1, and the source of N-type transistor $XN_1$ is coupled to the ground. In this exemplary embodiment, the foregoing setting of the control circuit is associated with whether fuses $F_{T1}$ and $F_{T2}$ are blown or not. It is noted that the fuses used in the controller chip Die_1 are not necessarily the same as those in the memory chip Die_0.

Figure 2:
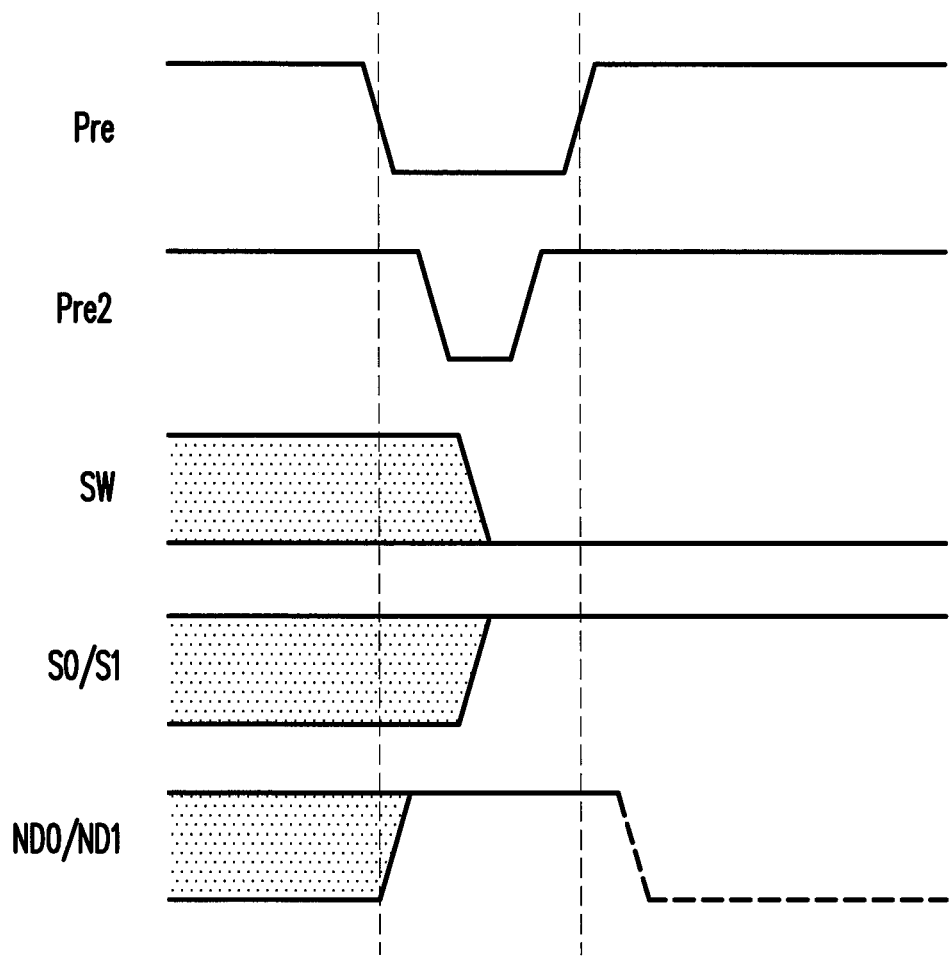
FIG. 2 is an operational view of an address translation circuit of a memory chip Die_0 according to an exemplary embodiment.

More clearly, FIG. 2 is an operational view (timing diagram) of the address translation circuit on the memory chip Die_0, according to an exemplary embodiment. Referring to FIG. 1 and FIG. 2 in combination, when the activating/enabling fuse Fx is blown, the switch control signal SW is low, and N-type transistors N1 and N2 are turned off, so that the discharge paths of fuse sets FS1 and FS2 are cut off. When the precharge control signal Pre transitions from low to high, TSVs V0 and V1 remain high, N-type transistors N3 to N6 are turned on, and nodes ND0 and ND1 are pulled down to ground, indicating that both redundant row R_row[0] and redundant column R_col[0] are deactivated.

When fuse $F_{T1}$ is blown, in response to the control of the precharge control signal xPre and complementary enabling signals en0/en0B and en1/en1B, TSVs V0 and V1 stay respectively low and high. Therefore, N-type transistor N4 is turned off and N-type transistor N6 is turned on, node ND0 remains at $V_{DD}$, and node ND1 is pulled down to ground. Apparently, once fuse $F_{T1}$ is blown, the controller chip Die_1 is able to activate/enable redundant row R_row[0] to replace row row[0] which contains the damaged memory cell DMC in the memory chip Die_0.

When fuse $F_{T2}$ is blown, in response to the control of the precharge control signal xPre and complementary enabling signals en0/en0B and en1/en1B, TSVs V0 and V1 stay respectively high and low. Therefore, N-type transistor N4 is turned on and N-type transistor N6 is turned off, node ND0 is pulled down to ground, and node ND1 remains at $V_{DD}$. Apparently, once fuse $F_{T2}$ is blown, the controller chip Die_1 is able to activate/enable redundant column R_col[0] to replace column col[0] which contains the damaged memory cell DMC in the memory chip Die_0.

It can be concluded that so long as the memory chip Die_0 has fuse Fx be blown before it is stacked with the controller chip Die_1, redundant row R_row[0] or redundant column R_col[0] in the memory chip Die_0 may still be activated/enabled by blowing out fuse $F_{T1}$ or $F_{T2}$ in the controller chip Die_1 to repair the damaged memory cell DMC in the memory chip Die_0, even after the memory chip Die_0 and the controller chip Die_1 are stacked.

Based on the content disclosed/taught in the above exemplary embodiment, those of ordinary skill in the art may obtain implementations of the address translation circuit for multiple redundant rows and columns built in the memory chip Die_0 and the corresponding control circuit in the controller chip Die_1 by analogy, and details thereof are not described herein again.

Figure 3:
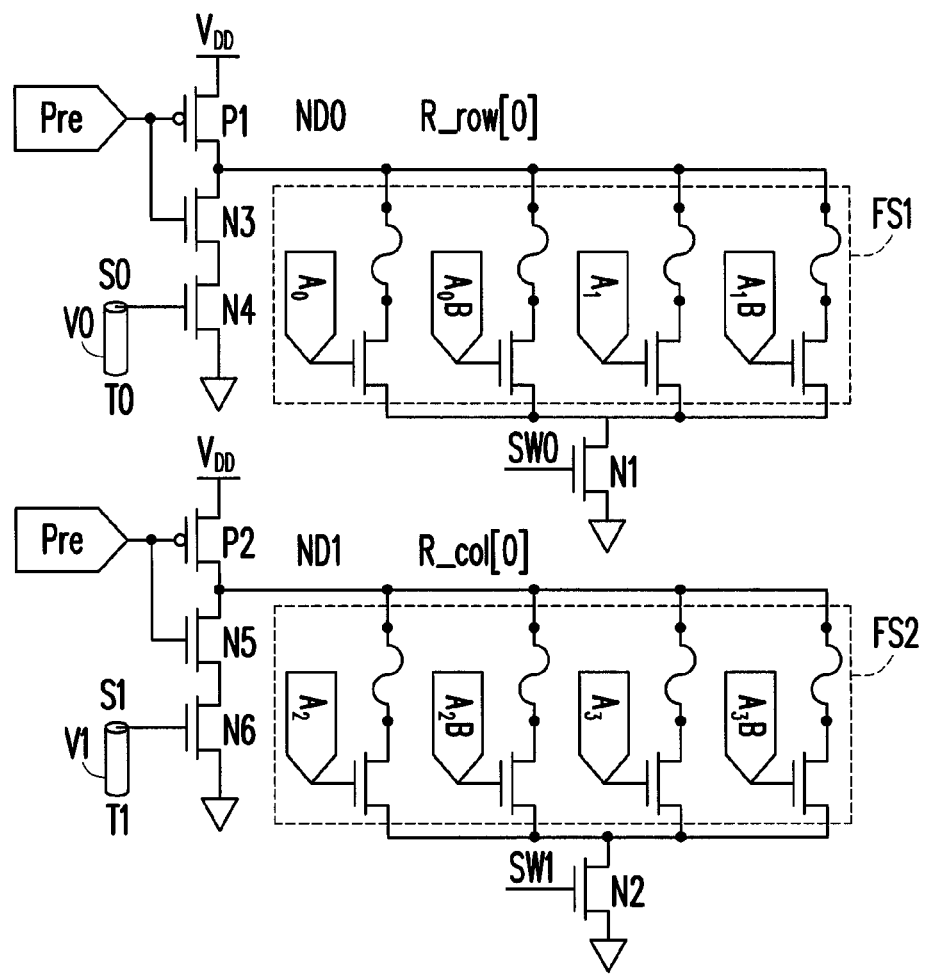
FIG. 3 to FIG. 5 are schematic views of an address translation circuit of a memory chip Die_0 according to another exemplary embodiment.
Figure 3:
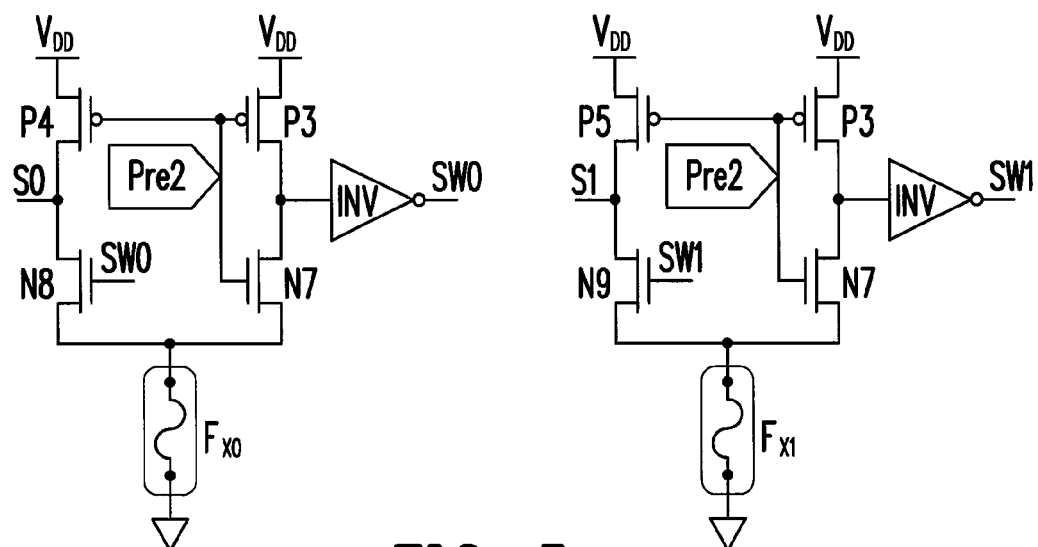

On the other hand, redundant row R_row[0] and redundant column R_col[0] in the memory chip Die_0 of the foregoing exemplary embodiment share the address translation circuit external activating/enabling unit; however, the disclosure is not limited thereto. More clearly, FIG. 3 is a schematic view of an address translation circuit in a memory chip Die_0 according to another exemplary embodiment of the disclosure. Referring to FIG. 1 and FIG. 3 in juxtaposition, an observable difference between the two address translation circuits lies in that redundant row R_row[0] and redundant column R_col[0] of the memory chip Die_0 in FIG. 3 do not share a common address translation circuit external activating/enabling unit as those in FIG. 1. In other words, redundant row R_row[0] and redundant column R_col[0] each have their own address translation circuit external activating/enabling unit in the memory chip Die_0 of FIG. 3.

Similarly, the address translation circuit external activating/enabling unit, corresponding to redundant row R_row[0] in the memory chip Die_0, may be coupled to a control circuit in the controller chip Die_1 through TSV V0, and in response to the setting of the control circuit in the controller chip Die_1 (i.e., whether fuse $F_{T1}$ is blown or not) and a preset condition (i.e., fuse $F_{x0}$ is blown), used to activate/enable redundant row R_row[0] in the memory chip Die_0 and to provide a control signal SW0 accordingly.

In addition, the address translation circuit external activating/enabling unit, corresponding to redundant column R_col[0] in the memory chip Die_0, may be coupled to a control circuit in the controller chip Die_1 through TSV V1, and in response to setting of the control circuit in the controller chip Die_1 (i.e., whether fuse $F_{T2}$ is blown or not) and a preset condition (i.e., fuse $F_{x1}$ is blown), used to activate/enable redundant column R_col[0] in the memory chip Die_0 and to provide a control signal SW1 accordingly.

Apparently, the address translation circuit, associated with redundant row R_row[0] and redundant column R_col[0] in the memory chip Die_0 shown in FIG. 3, is applicable to a case when a part of damaged memory cells are already repaired before the memory chip Die_0 and the controller chip Die_1 are stacked. It is assumed that redundant column R_col[0] is already used to repair another damaged memory cell in the memory chip Die_0 discovered before stacking, so that although fuse $F_{x1}$ in the address translation circuit external activating/enabling unit, corresponding to redundant column R_col[0], cannot be blown, fuse $F_{x0}$ in the address translation circuit external activating/enabling unit, corresponding to redundant row R_row[0], still can be blown.

In this manner, redundant row R_row[0] in the memory chip Die_0 is activated/enabled by blowing fuse $F_{T1}$ in the controller chip Die_1 to repair the damaged memory cell DMC in the memory chip Die_0 discovered after stacking, without affecting the already used redundant column R_col[0].

Figure 4:
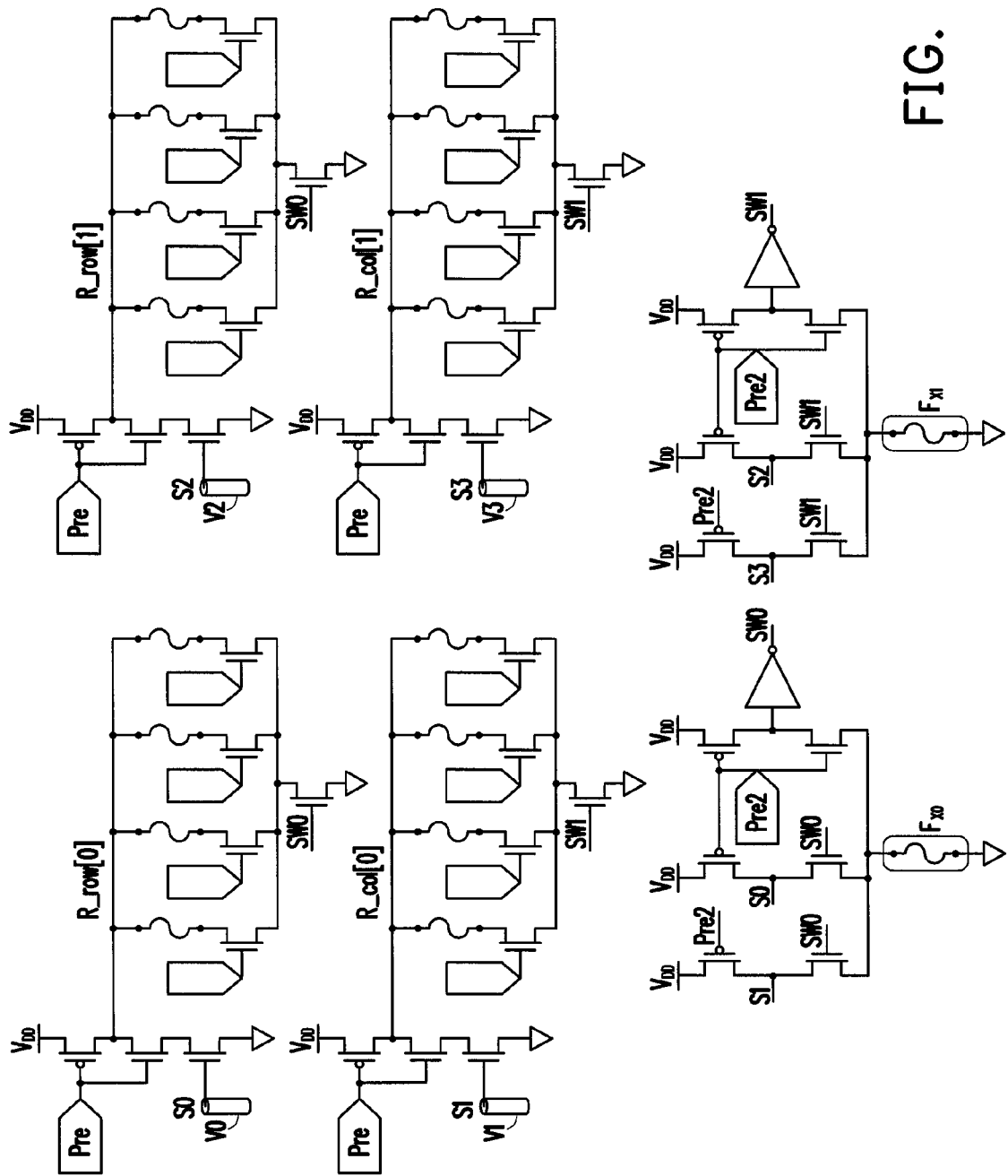

In addition, FIG. 4 is a schematic view of an address translation circuit of a memory chip Die_0, according to another exemplary embodiment of the disclosure. Referring to FIG. 4, two redundant rows R_row[0] and R_row[1] and two redundant columns R_col[0] and R_col[1] are built in the memory chip Die_0 shown in FIG. 4, and therefore, the size of the address translation circuit shown in FIG. 4 doubles that of the address translation circuit shown in FIG. 1. An address translation circuit external activating/enabling unit, corresponding to redundant rows R_row[0] and R_row[1], may be coupled to a control circuit in the controller chip Die_1 through TSVs V0 and V2, and in response to the setting of the control circuit in the controller chip Die_1 and a preset condition (i.e., fuse $F_{x0}$ is blown), determines to activate/enable redundant row R_row[0] and/or R_row[1], and provides a switch control signal SW0 accordingly.

Similarly, an address translation circuit external activating/enabling unit, corresponding to redundant columns R_col[0] and R_col[1], may be coupled to the control circuit in the controller chip Die_1 through TSVs V1 and V3, and in response to the setting of the control circuit in the controller chip Die_1 and a preset condition (i.e., fuse $F_{x1}$ is blown), determines to activate/enable redundant column R_col[0] and/or R_col[1], and provides a switch control signal SW1 accordingly.

Figure 5:
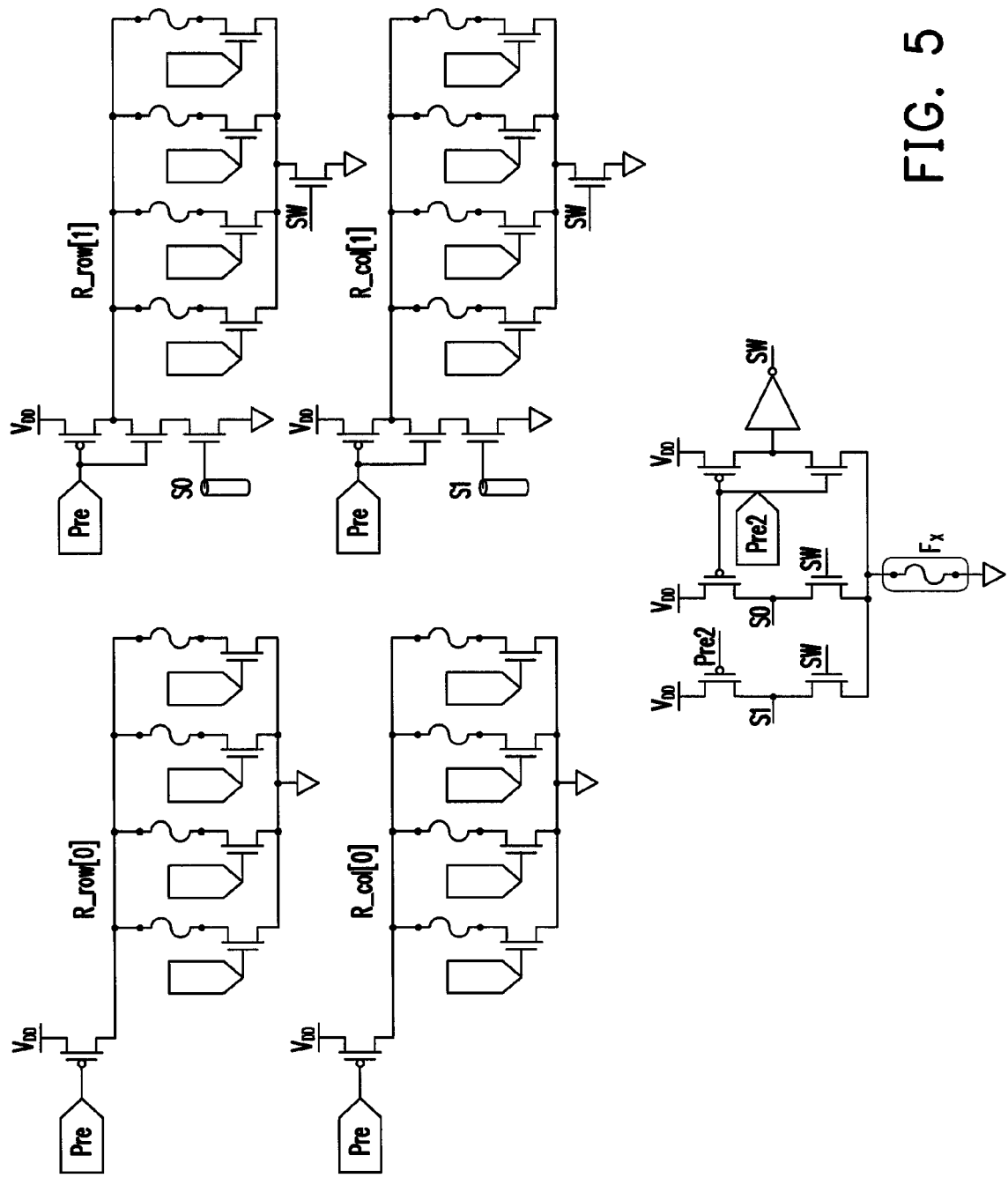

Further, FIG. 5 is a schematic view of an address translation circuit of a memory chip Die_0, according to another exemplary embodiment. Referring to FIG. 5, two redundant rows R_row[0] and R_row[1] and two redundant columns R_col[0] and R_col[1] are built in the memory chip Die_0 shown in FIG. 5. Compared with that shown in FIG. 4, an address translation circuit, corresponding to redundant rows R_row[0] and R_row[1] and redundant columns R_col[0] and R_col[1], share a common address translation circuit external activating/enabling unit with fuse $F_x$. As a result, the four redundant components can only be used as a whole before stacking or after stacking, determined by a condition whether fuse $F_x$ is blown or not.

Figure 6:
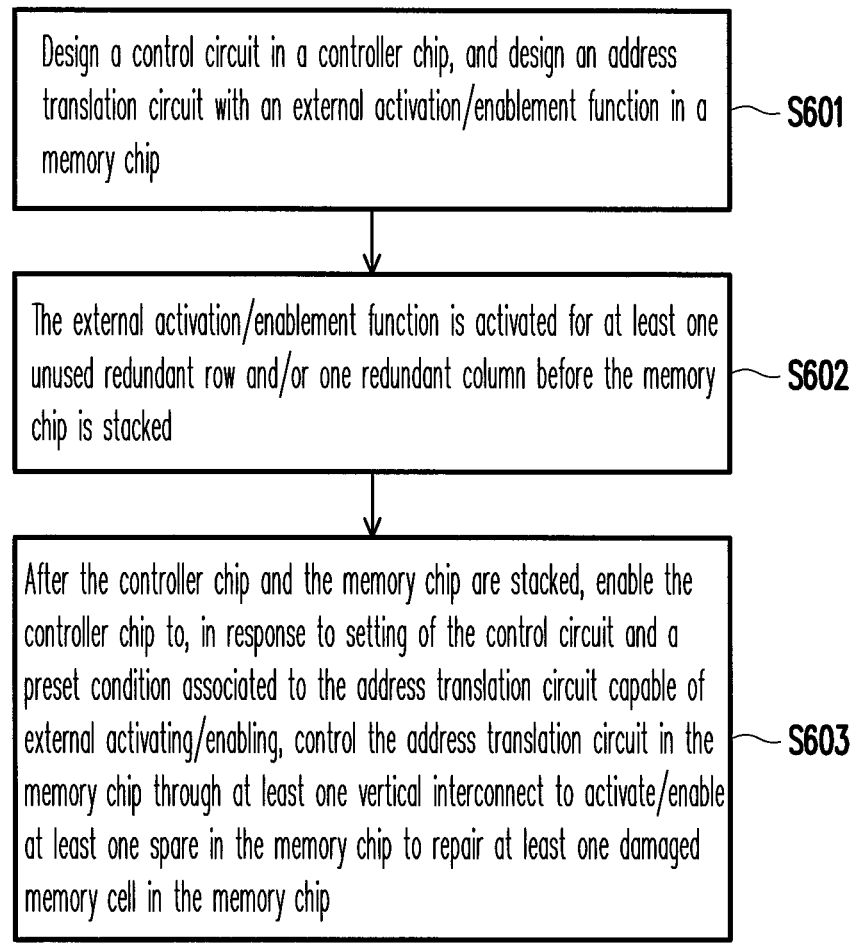
FIG. 6 is a flow chart of a method for memory repair after chip stacking of a 3-D IC according to an exemplary embodiment.

Based on the content disclosed/taught in the foregoing exemplary embodiments, FIG. 6 is a flow chart of a method capable of repairing a memory chip after the chip is stacked with a controller chip in a 3-D IC, according to an exemplary embodiment. Referring to FIG. 6, the method for memory repair after chip stacking in a 3-D IC according to this exemplary embodiment includes the following steps.

A control circuit is designed in a controller chip, and an address translation circuit with an external activation/enablement function is designed in a memory chip (Step S601).

The external activation/enablement function is activated for at least one unused redundant row and/or one redundant column before the memory chip is stacked (Step S602).

After the controller chip and the memory chip are stacked, the controller chip is able to, in response to the setting of the control circuit and a preset condition associated with the address translation circuit capable of external activation/enablement, control the address translation circuit in the memory chip through at least one TSV, so as to activate/enable at least one redundant row and/or one redundant column in the memory chip to repair at least one damaged memory cell in the memory chip (Step S603).

It should be noted that, in the foregoing exemplary embodiments, although the controller chip is used to control the address translation circuit in the memory chip through the TSV, the disclosure is not limited thereto. More clearly, in other exemplary embodiments, the controller chip may also control the address translation circuit in the memory chip through three-dimensional interconnects, such as a micro bump and a redistribution layer (RDL), whose usage is entirely based on actual design requirements.

In conclusion, the disclosure provides a technique of memory repair after chip stacking, which uses another stacked chip to enable/activate spares in a memory chip, so as to repair a damaged memory cell in the memory chip. In this manner, a problem of inconvenient access to an internal fuse circuit after chip stacking is solved. At the same time, flexible usage of the spare memory is provided, and the yield of the 3-D IC is improved.

It will be apparent to those skilled in the art that various modifications and variations can be made to the structure of the disclosed embodiments without departing from the scope or spirit of the disclosure. In view of the foregoing, it is intended that the disclosure cover modifications and variations of this disclosure provided they fall within the scope of the following claims and their equivalents.

What is claimed is:

1. A three-dimensional integrated circuit (3-D IC), comprising:
   a controller chip, comprising a control circuit, wherein the control circuit has at least one setting fuse; and
   a memory chip, comprising an address translation circuit with an external activation/enablement function, wherein the address translation circuit has at least one activating/enabling fuse,
   wherein after the controller chip and the memory chip are stacked, the controller chip, in response to the setting of the control circuit and a preset condition associated with the address translation circuit capable of external activation/enablement, controls the address translation circuit in the memory chip through at least one vertical interconnect to activate/enable at least one spare in the memory chip to repair at least one damaged memory cell in the memory chip,
   wherein in case that the activating/enabling fuse is already blown, the at least one spare in the memory chip is capable of being activated or enabled by blowing the at least one setting fuse.

2. The 3-D IC according to claim 1, wherein the at least one spare comprises a first redundant row, the at least one vertical interconnect comprises a first through-silicon via (TSV), and the address translation circuit comprises:
   a first P-type transistor, comprising a gate for receiving a first control signal and a source coupled to a power supply;
   a first N-type transistor, comprising a gate for receiving a second control signal and a source coupled to a ground potential;
   a first fuse set, corresponding to the first redundant row and coupled between drains of the first P-type transistor and the first N-type transistor; and
   an address translation circuit external activating/enabling unit, coupled to the control circuit through the first TSV, and used for, in response to the setting of the control circuit and the preset condition, determining whether to activate/enable the first redundant row or not, and providing the second control signal accordingly.

3. The 3-D IC according to claim 2, wherein the first fuse set comprises:
   multiple first fuses, each comprising a first end coupled to the drain of the first P-type transistor; and
   multiple second N-type transistors, comprising gates for receiving a first input address, drains respectively coupled to second ends of the first fuses, and sources coupled to the drain of the first N-type transistor.

4. The 3-D IC according to claim 3, wherein the address translation circuit external activating/enabling unit comprises:
   a third N-type transistor, comprising a gate coupled to the gate of the first P-type transistor and a drain coupled to the drain of the first P-type transistor;
   a fourth N-type transistor, comprising a gate coupled to the control circuit through the first TSV, a drain coupled to a source of the third N-type transistor, and a source coupled to the round potential;
   a second P-type transistor, comprising a gate for receiving a third control signal, a source coupled to the power supply, and a drain coupled to the gate of the fourth N-type transistor;
   a third P-type transistor, comprising a source coupled to the power supply and a gate coupled to the gate of the second P-type transistor;
   a fifth N-type transistor, comprising a gate for receiving the second control signal and a drain coupled to the drain of the second P-type transistor;
   a sixth N-type transistor, comprising a gate coupled to the gate of the second P-type transistor and a drain coupled to a drain of the third P-type transistor;
   an inverter, comprising an input end coupled to the drain of the third P-type transistor and an output end for outputting the second control signal; and
   the activating/enabling fuse, comprising a first end coupled to sources of the fifth and sixth N-type transistors and a second end coupled to the ground potential, wherein
   the preset condition is that the activating/enabling fuse is already blown.

5. The 3-D IC according to claim 4, wherein the control circuit comprises:
   a first sub-control unit, corresponding to the first redundant row, and comprising:
      a fourth P-type transistor, comprising a gate for receiving a fourth control signal and a source coupled to the power supply;
      a seventh N-type transistor, comprising a gate coupled to the gate of the fourth P-type transistor and a drain coupled to a drain of the fourth P-type transistor;
      a first setting fuse, comprising a first end coupled to a source of the seventh N-type transistor and a second end coupled to the ground potential;
      a first transmission gate, comprising an input end coupled to the drain of the fourth P-type transistor and two control ends for receiving complementary first and second enabling signals respectively; and
      an eighth N-type transistor, comprising a gate coupled to an output end of the first transmission gate, a drain coupled to the gate of the fourth N-type transistor through the first TSV, and a source coupled to the ground potential.

6. The 3-D IC according to claim 5, wherein the at least one spare comprises a first redundant column, the at least one vertical interconnect further comprises a second TSV, and the address translation circuit further comprises:
   a fifth P-type transistor, comprising a gate for receiving the first control signal and a source coupled to the power supply;
   a ninth N-type transistor, comprising a gate for receiving the second control signal and a source coupled to the ground potential; and
   a second fuse set, corresponding to the first redundant column and coupled between drains of the fifth P-type transistor and the ninth N-type transistor.

7. The 3-D IC according to claim 6, wherein the address translation circuit external activating/enabling unit is further coupled to the control circuit through the second TSV, and used for, in response to the setting of the control circuit and the preset condition, determining whether to activate/enable the first redundant column or not.

8. The 3-D IC according to claim 7, wherein the second fuse set comprises:
   multiple second fuses, each comprising a first end coupled to the drain of the fifth P-type transistor; and
   multiple tenth N-type transistors, comprising gates for receiving a second input address, drains respectively coupled to second ends of the second fuses, and sources coupled to the drain of the ninth N-type transistor.

9. The 3-D IC according to claim 8, wherein the address translation circuit external activating/enabling unit further comprises:
   an eleventh N-type transistor, comprising a gate coupled to the gate of the fifth P-type transistor and a drain coupled to the drain of the fifth P-type transistor;
   a twelfth N-type transistor, comprising a gate coupled to the control circuit through the second TSV, a drain coupled to a source of the eleventh N-type transistor, and a source coupled to the ground potential;
   a sixth P-type transistor, comprising a gate for receiving the third control signal, a source coupled to the power supply, and a drain coupled to the gate of the twelfth N-type transistor; and
   a thirteenth N-type transistor, comprising a gate for receiving the second control signal, a drain coupled to the drain of the sixth P-type transistor, and a source coupled to the first end of the activating/enabling fuse.

10. The 3-D IC according to claim 9, wherein the control circuit further comprises:
    a second sub-control unit, corresponding to the first redundant column, and comprising:
       a seventh P-type transistor, comprising a gate for receiving the fourth control signal and a source coupled to the power supply;
       a fourteenth N-type transistor, comprising a gate coupled to the gate of the seventh P-type transistor and a drain coupled to a drain of the seventh P-type transistor;
       a second setting fuse, comprising a first end coupled to a source of the fourteenth N-type transistor and a second end coupled to the ground potential;
       a second transmission gate, comprising an input end coupled to the drain of the seventh P-type transistor and two control ends for receiving complementary third and fourth enabling signals respectively; and
       a fifteenth N-type transistor, comprising a gate coupled to an output end of the second transmission gate, a drain coupled to the gate of the twelfth N-type transistor through the second TSV, and a source coupled to the ground potential.

11. The 3-D IC according to claim 1, wherein the at least one spare comprises a first redundant row and a first redundant column, the at least one vertical interconnect comprises a first and a second TSVs, and the address translation circuit comprises:
- a first P-type transistor, comprising a gate for receiving a first control signal and a source coupled to a power supply;
- a first N-type transistor, comprising a gate for receiving a second control signal and a source coupled to a ground potential;
- a first fuse set, corresponding to the first redundant row, and coupled between drains of the first P-type transistor and the first N-type transistor;
- a first address translation circuit external activating/enabling unit, coupled to the control circuit through the first TSV, and used for, in response to the setting of the control circuit and a preset condition, determining whether to activate/enable the first redundant row or not, and providing the second control signal accordingly;
- a second P-type transistor, comprising a gate for receiving the first control signal and a source coupled to the power supply;
- a second N-type transistor, comprising a gate for receiving a third control signal and a source coupled to the ground potential;
- a second fuse set, corresponding to the first redundant column, and coupled between drains of the second P-type transistor and the second N-type transistor; and
- a second address translation circuit external activating/enabling unit, coupled to the control circuit through the second TSV, and used for, in response to the setting of the control circuit and the preset condition, determining whether to activate/enable the first redundant column or not, and providing the third control signal accordingly.

12. The 3-D IC according to claim 1, wherein the at least one spare comprises a first and a second redundant rows and a first and a second redundant columns, the at least one vertical interconnect comprises first to fourth TSVs, and the address translation circuit comprises:
- a first P-type transistor, comprising a gate for receiving a first control signal and a source coupled to a power supply;
- a first N-type transistor, comprising a gate for receiving a second control signal and a source coupled to a ground potential;
- a first fuse set, corresponding to the first redundant row, and coupled between drains of the first P-type transistor and the first N-type transistor;
- a second P-type transistor, comprising a gate for receiving the first control signal and a source coupled to the power supply;
- a second N-type transistor, comprising a gate for receiving the second control signal and a source coupled to the ground potential;
- a second fuse set, corresponding to the second redundant row, and coupled between drains of the second P-type transistor and the second N-type transistor;
- a first address translation circuit external activating/enabling unit, coupled to the control circuit through the first and the second TSVs, and used for, in response to the setting of the control circuit and a preset condition, determining whether to activate/enable the first and the second redundant rows or not, and providing the second control signal accordingly;
- a third P-type transistor, comprising a gate for receiving the first control signal and a source coupled to the power supply;
- a third N-type transistor, comprising a gate for receiving a third control signal and a source coupled to the ground potential;
- a third fuse set, corresponding to the first redundant column, and coupled between drains of the third P-type transistor and the third N-type transistor;
- a fourth P-type transistor, comprising a gate for receiving the first control signal and a source coupled to the power supply;
- a fourth N-type transistor, comprising a gate for receiving the third control signal and a source coupled to the ground potential;
- a fourth fuse set, corresponding to the second redundant column, and coupled between drains of the fourth P-type transistor and the fourth N-type transistor; and
- a second address translation circuit external activating/enabling unit, coupled to the control circuit through the third and the fourth TSVs, and used for, in response to the setting of the control circuit and the preset condition, determining whether to activate/enable the first and the second redundant columns or not, and providing the third control signal accordingly.

13. The 3-D IC according to claim 1, wherein the at least one spare comprises a first and a second redundant rows and a first and a second redundant columns, the at least one vertical interconnect comprises a first and a second TSVs, and the address translation circuit comprises:
- a first P-type transistor, comprising a gate for receiving a first control signal and a source coupled to a power supply;
- a first fuse set, corresponding to the first redundant row, and coupled between a drain of the first P-type transistor and a ground potential;
- a second P-type transistor, comprising a gate for receiving the first control signal and a source coupled to the power supply;
- a first N-type transistor, comprising a gate for receiving a second control signal and a source coupled to the ground potential;
- a second fuse set, corresponding to the second redundant row, and coupled between drains of the second P-type transistor and the first N-type transistor;
- a first address translation circuit external activating/enabling unit, coupled to the control circuit through the first TSV, and used for, in response to the setting of the control circuit and a preset condition, determining whether to activate/enable the second redundant row or not, and providing the second control signal accordingly;
- a third P-type transistor, comprising a gate for receiving the first control signal and a source coupled to the power supply;
- a third fuse set, corresponding to the first redundant column, and coupled between a drain of the third P-type transistor and the ground potential;
- a fourth P-type transistor, comprising a gate for receiving the first control signal and a source coupled to the power supply;
- a second N-type transistor, comprising a gate for receiving a third control signal and a source coupled to the ground potential;
- a fourth fuse set, corresponding to the second redundant column, and coupled between drains of the fourth P-type transistor and the second N-type transistor; and
- a second address translation circuit external activating/enabling unit, coupled to the control circuit through the second TSV, and used for, in response to the setting of the control circuit and the preset condition, determining whether to activate/enable the second redundant row or not, and providing the third control signal accordingly.

14. A method for memory repair after stacking of a three-dimensional integrated circuit (3-D IC), comprising:
designing a control circuit in a controller chip having at least one setting fuse, and designing an address translation circuit with an external activation/enablement function and having at least one activating/enabling fuse in a memory chip;
activating the external activation/enablement function for at least one unused redundant row and/or one redundant column by blowing the at least one activating/enabling fuse before the memory chip is stacked; and
after the controller chip and the memory chip are stacked, enabling the controller chip, in response to the setting of the control circuit and a preset condition associated with the address translation circuit capable of external activation/enablement, to control the address translation circuit in the memory chip through at least one through-silicon via (TSV), so as to activate/enable at least one redundant row and/or one redundant column in the memory chip to repair at least one damaged memory cell in the memory chip,
wherein in case that the activating/enabling fuse is already blown, the at least one redundant row and/or one redundant column in the memory chip is capable of being activated or enabled by blowing the at least one setting fuse.

* * * * *